United States Patent [19]

Przybysz et al.

[11] Patent Number: 4,514,898

[45] Date of Patent: May 7, 1985

[54] METHOD OF MAKING A SELF PROTECTED THYRISTOR

[75] Inventors: John X. Przybysz, Penn Hills; John A. Ostop, Youngwood, both of Pa.

[73] Assignee: Westinghouse Electric Corp., Pittsburgh, Pa.

[21] Appl. No.: 468,016

[22] Filed: Feb. 18, 1983

[51] Int. Cl.³ ............... H01L 21/223; H01L 21/302; H01L 29/74

[52] U.S. Cl. .................... 29/582; 29/580; 29/583; 357/20; 357/38; 148/187

[58] Field of Search ............. 29/580, 581, 582, 583, 29/591; 219/121 LG, 121 LH, 121 LJ; 357/38, 20, 13; 148/187

[56] References Cited

U.S. PATENT DOCUMENTS 4,047,219 9/1977 Temple ........................... 357/38

OTHER PUBLICATIONS

Przybysz, J. X. et al., "Thyristors with Overvoltage Self-Protection" in *1981 International Electron Device Meeting Technical Digest*, pp. 410–413.

Primary Examiner—Brian E. Hearn
Assistant Examiner—Alan E. Schiavelli
Attorney, Agent, or Firm—C. L. Menzemer

[57] ABSTRACT

The present invention is directed to a thyristor self-protected against overvoltage by the avalanche mechanism, the protection resulting from a laser scribed ring shaped groove cut in the top surface of the thyristor and extending into one base region of the thyristor whereby the forward blocking junction is contoured toward the reverse blocking junction under the ring shaped groove, and to the process for making the thyristor.

4 Claims, 4 Drawing Figures

METHOD OF MAKING A SELF PROTECTED THYRISTOR

CROSS REFERENCE TO RELATED APPLICATION

The present application is related to patent application Ser. No. 434,192, filed Oct. 13, 1982, the assignee of which is the same as that of the present invention.

BACKGROUND OF THE INVENTION

1. Field of the Invention

The present invention is in the field of power semiconductors generally and is specifically directed to overvoltage self-protected thyristors.

2. Description of the Prior Art

Typically overvoltage protection of a thyristor employs an avalanche current in the gate region to trigger the thyristor. The avalanching is achieved by etching a deep well, approximately 10 mils, in the gate region, during processing of a silicon wafer, the etching usually occurring after an aluminum diffusion and before a gallium diffusion is carried out. The avalanche voltage is determined by the depth and profile of the etched well.

The use of avalanching for self-protection will succeed or fail depending upon whether the avalanche voltage is less than or more than the edge breakdown voltage of the device.

The use of avalanching necessarily involves some derating of the electrical parameters of the device. Particularly, there is a derating of the forward blocking voltage, $V_{DRM}$, along with an attendant increase in forward drop, $V_F$, for the same $V_{DRM}$.

The deep well prior art is discussed in "Thyristors With Overvoltage Self-Protection", J. X. Przybysz and E. S. Schlegel, 1981 IEDM, pgs. 410–413. No patent was ever filed since rights accrue to EPRI, who declined to file.

Two other prior art methods of overvoltage protection are (1) a thinned anode base for controlling $V_{BO}$ location and voltage level, and (2) using a curved forward blocking junction.

The thin anode base and curved junction technique for achieving overvoltage protection are discussed in "Controlled Thyristor Turn-On For High DI/DT Capability", V. A. K. Temple, 1981 IEDM, pgs. 406–409.

The use of auxiliary thyristors and inhomogeneous or heterogeneous doping of the n-type base region is discussed in "A Thyristor Protected Against di/dt Failure At Breakdown Turn-On", P. Voss, Solid State Electronics, 1974, Vol. 17, pgs. 655–661.

U.S. Pat. No. 4,003,072 teaches curved junctions as a means of overvoltage protection.

"A New Bipolar Transistor-GAT", Hisao Kondo and Yoshinori Yukimoto, IEEE Transactions On Electronic Devices, Vol. Ed. 27 No. 2, February 1980, pgs. 373–379 is a typical example of prior art teachings of a transistor in which the base region has portions extending deeper into the collector region than the remainder of the base region to contact the depletion region.

Application Ser. No. 190,699 filed Sept. 25, 1980 is an example of several applications filed in which the p-type base region of a thyristor has spaced-apart portions extending into the n-type base region to contact the depletion region.

Application Ser. No. 357,106, filed Mar. 3, 1982 teaches providing overvoltage protection in a thyristor by pulsing the center of a gating region of a thyristor with a laser thereby deforming the blocking junction and resulting in a portion of the p-type base extending into the n-type base region.

SUMMARY OF THE INVENTION

A process for making a thyristor, said thyristor being self-protected from overvoltage by the avalanche mechanism, comprising, forming regions of a second-type semiconductivity in a body of semiconductor material of a first-type semiconductivity by diffusing a doping material capable of forming a region of second-type semiconductivity through opposed major surfaces of said body, said opposed major surfaces comprising top and bottom surfaces of said body, forming by laser etching a ring shaped groove in a central portion of said top surface of said body, said groove extending entirely through said region of second-type semiconductivity, formed by diffusion through said top surface and into said body of first-type of semiconductivity, diffusing a second doping material capable of forming a region of second type conductivity through said top and bottom surfaces of said body, said second doping material diffusing through said groove, whereby a region of said second type of semiconductivity is formed adjacent to said groove in said body and said region becoming a part of said region formed by diffusion through said top surface, forming at least two circular regions of said first type of semiconductivity in said region of second type semiconductivity formed by diffusion through said top surface, said two circular regions being spaced apart from each other and from said groove, said two circular regions extending into said region of second type of semiconductivity in which they are formed to a width less than the width of the region in which they are formed, affixing first metal electrical contacts to said top surface of said body in ohmic electrical contact with said circular regions and said region of second-type of conductivity, whereby said regions are electrically shorted to each other, affixing a second metal electrical groove contact to said top surface in ohmic electrical contact with walls of said groove and affixing a third electrical contact to the bottom surface of said body in ohmic electrical contact with said region of second-type semiconductivity formed by diffusion through said bottom surface of said body.

The present invention also includes a thyristor self protected from overvoltage by avalanche, comprising a top surface and a bottom surface, a first base region, said first base region extending from the top surface into said thyristor, a first emitter region disposed within said first base region and extending to the top surface of said thyristor, said first emitter region being spaced apart from a central portion of said top surface, an auxiliary emitter region disposed within said first base region, said auxiliary emitter region being spaced apart from said first emitter region and from said central portion, a first metal electrode in ohmic electrical contact with said first emitter region and said first base region, a second metal electrode in ohmic electrical contact with said auxiliary emitter region and said first base region, a first pn junction between said first emitter region and said first base region, a second base region adjacent to said first base region, a second pn junction between said first base region and said second base region, a second emitter region adjacent to said second base region and extending from said second base region to said bottom surface, a third pn junction between said second base region and said second emitter region, said second pn junction being a forward blocking junction and said third pn junction being a reverse blocking junction, a circular groove disposed within said first base region, said groove being spaced apart from said first emitter region and said auxiliary emitter region, said groove extending from the central portion of the top surface of said thyristor into the first base region a predetermined distance, said predetermined distance being such that said forward blocking junction under said groove is contoured toward said reverse blocking junction, whereby, said second base region has a first width under said groove which is less than the width of the remainder of the second base region, a third metal electrode affixed to walls of said groove and a fourth metal electrode affixed to the bottom surface of the thyristor in ohmic electrical contact with the second emitter region.

BRIEF DESCRIPTION OF THE DRAWINGS

For a better understanding of the present invention reference should be had to the following detailed discussion and drawings, in which.

DESCRIPTION OF THE PREFERRED EMBODIMENTS

Figure 1:
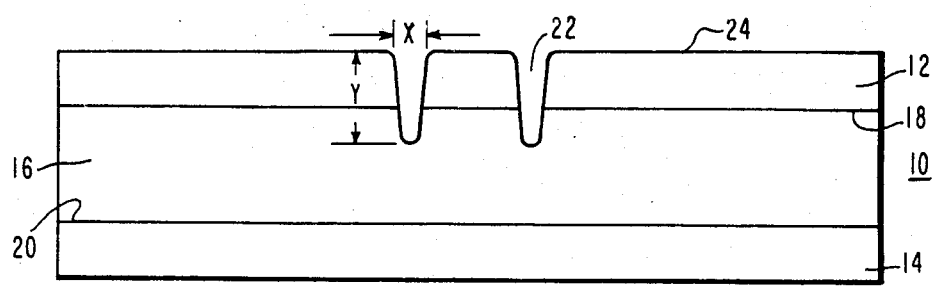
FIGS. 1 to 3 are side views of a body of semiconductor material being processed in accordance with the teachings of this invention.

With reference to FIG. 1, there is shown a body of semiconductor material 10, preferably silicon. The body 10, which was originally of 220 ohm-cm n-type conductivity has had a first p-type conductivity region 12 and a second p-type region 14 formed therein by diffusion. The doping material used to form regions 14 and 16 is preferably aluminum.

The original n-type material now forms n-type region 16.

There is a pn junction 18 between regions 12 and 16 and a pn junction 20 between regions 14 and 16.

A circular or ring shaped groove 22 is then cut into top surface 24 of body 10 with a laser.

The width "X" of the groove should be as narrow as possible, the use of a laser allows cutting of grooves that are typically five mils wide.

The depth "Y" of the groove will depend on the desired electrical parameters of the final thyristor and will be discussed in more detail below.

Any laser known to those skilled in the art that will etch silicon may be used to cut the groove 22. Examples of suitable lasers include ruby and YAG lasers. Particularly satisfactory is a Q switch YAG laser 25 watts, 10 KHz with approximately 2.5 millijoules per pulse.

Figure 2:
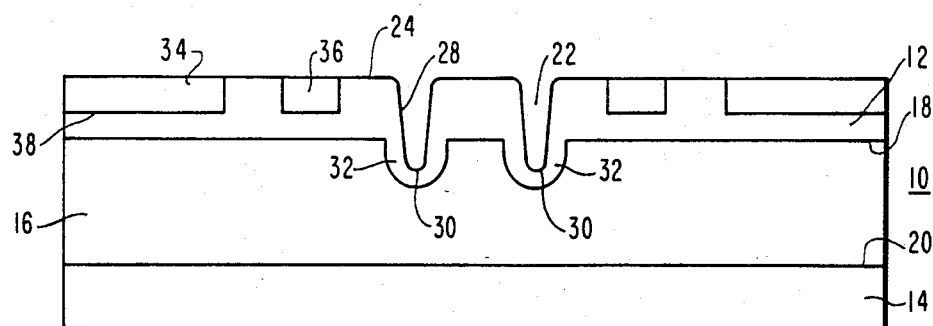

With reference to FIG. 2, a second p-type dopant, preferably gallium, is then diffused into the body 10 through top surface 24 and bottom surface 26 of body 10.

During the second diffusion, the p-type dopant, preferably gallium, in addition to increasing the doping concentration in already formed p-type regions 12 and 14, diffuses through side walls 28 and bottom surface 30 of the groove 22. The diffusion of the p-type dopant through the bottom surface 30 of groove 22 results in the formation of a p-type portion 32 along the bottom portion of the groove 22. The p-type portion 32 becomes a part of p-type region 12.

N-type regions 34 and 36 are then formed by diffusion of an n-type dopant, for example phosphorus, through top surface 24 of body 10. There is a pn junction 38 between region 34 and region 12 and a pn junction 40 between regions 36 and 12.

Figure 3:
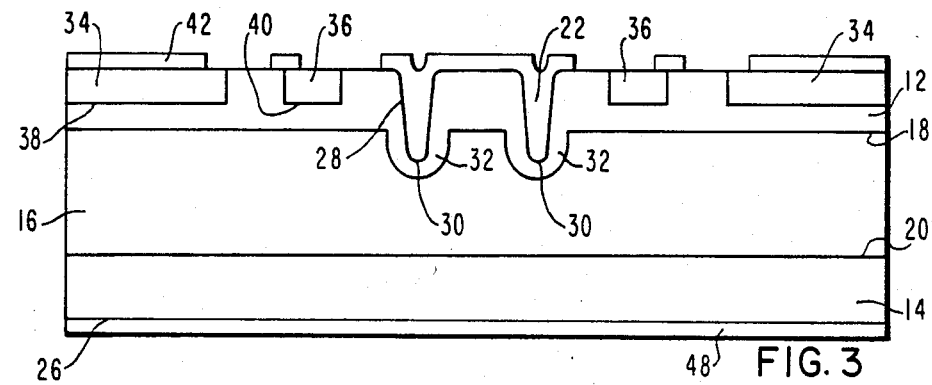

With reference to FIG. 3 a first metal electrode 42 is affixed along top surface 24, in an electrical ohmic contact relationship with region 34. A second metal electrode 44 is affixed along top surface 24, in an electrical ohmic contact relationship with regions 36 and 12. The electrical ohmic contact 44 electrically shorts region 36 to region 12. A third metal electrode 46 is affixed along top surface 24 in ohmic electrical contact with the side walls 28 and bottom surface 30 of groove 22.

The first, second and third metal electrodes 42, 44 and 46 respectively are preferably of aluminum and may be affixed in their respective positions by metal deposition or sputtering techniques known to those skilled in the art.

A fourth metal electrode 48 is affixed along bottom surface 26 of body 10 in an ohmic electrical contact with region 14.

The metal electrode 48 is preferably of molybdenum.

Figure 4:
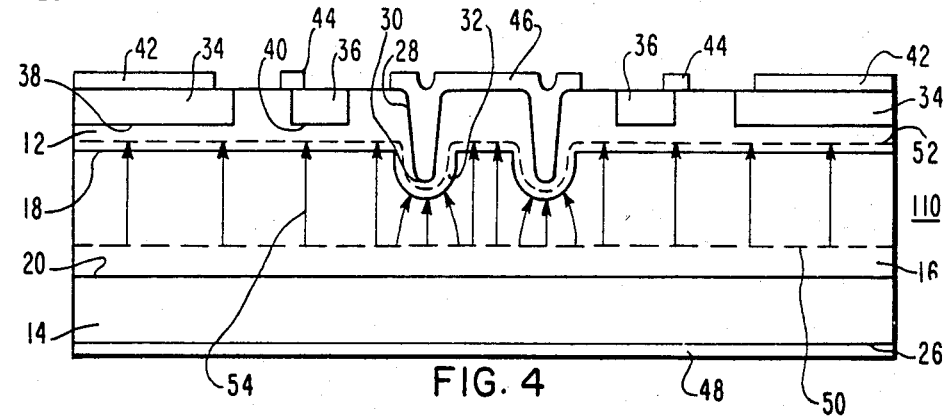
FIG. 4 is a side view of a thyristor prepared in accordance with the teachings of this invention.

With reference to FIG. 4, there is shown the completed device which is a thyristor 110.

The thyristor 110 consists of the n-type region 34 which is the cathode emitter region of the thyristor 110. The first p-type region 12 which is the cathode base region. The original n-type region 16 which is the anode base region. The second p-type region 14 which is the anode emitter region. The region 36 is an auxiliary emitter or floating gate region.

The pn junction 18 between cathode base region 12 and anode base region 16 is the forward blocking pn junction. The pn junction 20 between anode base region 16 and anode emitter region 14 is the reverse blocking junction.

The first metal electrode 42 is the cathode emitter electrode. The second metal electrode 44 is the auxiliary emitter or floating gate region electrode and bridge the pn junction 40 thereby electrically shorting the cathode base region 12 and the auxiliary emitter or floating gate region. The third metal electrode 46 is the gate electrode. The fourth metal electrode 48 is the anode emitter electrode.

Typically, in a 2800 volt thyristor the cathode emitter region 34 and the auxiliary emitter or foating gate regions 36 will have a width of 17 microns and be doped to a surface concentration of $10^{20}$ atoms/cc.

The cathode base region 12 will have a width of 125 microns and is doped to a surface concentration of $8 \times 10^{17}$ atoms/cc.

The anode base region 16 will have a width of 525 microns and a resistivity of 160 ohm-cm.

The anode emitter region 14 will have a width of 125 microns and is doped to a surface concentration of $8 \times 10^{17}$ atoms/cc.

The width "X", FIG. 1 of the groove 22 is as narrow as can be obtained utilizing the state of the art approximately 5 mils. The diameter of the groove is about 60 mils and the diameter of electrode 46 is about 80 mils. The distance between the auxiliary emitter region 36 and the electrode 46 should be from 150 to 225 microns to ensure that avalanching occurs in the center of the gate region away from the floating gate region 36. Locating the groove 22 away from the gate region 36 ensures that the electrical gating parameters of the thyristor are unchanged by the presence of the groove 22.

When a voltage is impressed across the emitter electrodes 42 and 48 a depletion region denoted by dotted lines 50 and 52 is established within the thyristor 110 (FIG. 4). An electric field, denoted by arrows 54, is the forward blocking state. The higher electric field concentration in the vicinity of the grooves causes avalanche breakdown in the gate region.

We claim as our invention:

1. A process for making a thyristor, said thyristor being self-protected from overvoltage by avalanche, comprising, forming two regions of a second type of semiconductivity in a body of semiconductor material of a first type of semiconductivity by diffusing a first doping material capable of forming a region of second type semiconductivity through opposed major surfaces of said body, said opposed major surfaces comprising top and bottom surfaces of said body, forming by laser etching a ring shaped groove in a central portion of said top surface of said body, said groove extending entirely through said region of second type semiconductivity, formed by diffusion through said top surface, and into said body of first type semiconductivity, diffusing a second doping material capable of forming a region of second type semiconductivity through said top and bottom surfaces of said body, said second doping material diffusing through said groove, whereby a region of said second type of semiconductivity is formed adjacent to said groove in said body, said region extending into and becoming a part of said region of second type semiconductivity formed by diffusion through said top surface, forming at least two regions of said first type of semiconductivity in said region of second type semiconductivity formed by diffusion through said top surface, said at least two regions being spaced apart from each other and from said groove, said two regions extending into said region of second type semiconductivity to a width less than the width of the region of second type semiconductivity, affixing first metal electrical contacts to said top surface of said body of semiconductor material in ohmic electrical contact with said regions of first type semiconductivity and said region of second type semiconductivity whereby said regions are electrically shorted to each other, affixing a second metal electrical contact to said top surface in ohmic electrical contact with walls of said groove, and affixing a third electrical contact to the bottom surface of said body in ohmic electrical contact with said region of second type semiconductivity formed by diffusion through said bottom surface of said body.

2. The process of claim 1 in which said first doping material is aluminum and said second doping material is gallium.

3. The process of claim 2 in which the groove is etched with a YAG laser.

4. The process of claim 3 in which the first and second metal electrical contacts consist of aluminum and the third metal electrical contact consists of molybdenum.

* * * * *